(12) United States Patent
Sukekawa

(10) Patent No.: US 11,917,814 B2
(45) Date of Patent: Feb. 27, 2024

(54) SEMICONDUCTOR DEVICE

(71) Applicant: MICRON TECHNOLOGY, INC., Boise, ID (US)

(72) Inventor: Mitsunari Sukekawa, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 104 days.

(21) Appl. No.: 17/711,972

(22) Filed: Apr. 1, 2022

(65) Prior Publication Data

US 2023/0320072 A1    Oct. 5, 2023

(51) Int. Cl.
*H10B 12/00*    (2023.01)

(52) U.S. Cl.
CPC .......... *H10B 12/315* (2023.02); *H10B 12/50* (2023.02)

(58) Field of Classification Search
CPC .. H10B 12/0335; H10B 12/053; H10B 12/09; H10B 12/315; H10B 12/34; H10B 12/482; H10B 12/488; H10B 12/50
See application file for complete search history.

(56) References Cited

U.S. PATENT DOCUMENTS

2011/0292717 A1* 12/2011 Ohgami .............. G11C 11/4074
257/296

* cited by examiner

*Primary Examiner* — Meiya Li
(74) *Attorney, Agent, or Firm* — Dorsey & Whitney LLP

(57) ABSTRACT

An apparatus includes: a memory mat including a plurality of vertical memory cell transistors; a shield structure covering the memory mat and surrounding each of the plurality of vertical memory cell transistors; and a ring-shaped wiring above the shield structure, the ring-shaped wiring being connected to the shield structure in an edge region of the shield structure.

18 Claims, 11 Drawing Sheets

SEMICONDUCTOR DEVICE

BACKGROUND

It has been recently desired to increase memory capacity for semiconductor devices exemplified by Dynamic Random Access Memory, but it has been technically difficult to increase the memory capacity by reducing the processing dimension. Therefore, a technique has been devised in which access transistors and storage capacitors in memory cells are configured in a vertical structure to reduce planar areas of the memory cells and increase the memory capacity.

BRIEF DESCRIPTION OF THE DRAWINGS

FIGS. 4 to 13 are diagrams showing a method of manufacturing the semiconductor device according to the embodiment, and are vertical cross-sectional views showing a schematic configuration of the semiconductor device in an exemplary process stage, and also are vertical cross-sectional views showing an outline of a portion taken along the G-G line of FIG. 3 respectively.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

A semiconductor device according to an embodiment and a manufacturing method therefor will be described hereunder with reference to the drawings. In the following description, a dynamic random access memory (hereinafter referred to as DRAM) will be described as an example of a semiconductor device. In the description of the embodiment, common or related elements, or substantially the same elements are designated by the same reference signs, and duplicative description thereof will be omitted. In the following figures, the dimensions and dimensional ratios of the respective parts in each figure do not necessarily match the dimensions and dimensional ratios in the embodiment. Further, in the following description, a Y direction is a direction perpendicular to an X direction. A Z direction is a direction perpendicular to an X-Y plane which is a plane of a semiconductor substrate, and is also referred to as a vertical direction. The X, Y, and Z directions in the figures are displayed with reference to the directions in a first structure K described later.

A semiconductor device according to an embodiment will be described hereinafter.

Figure 1:
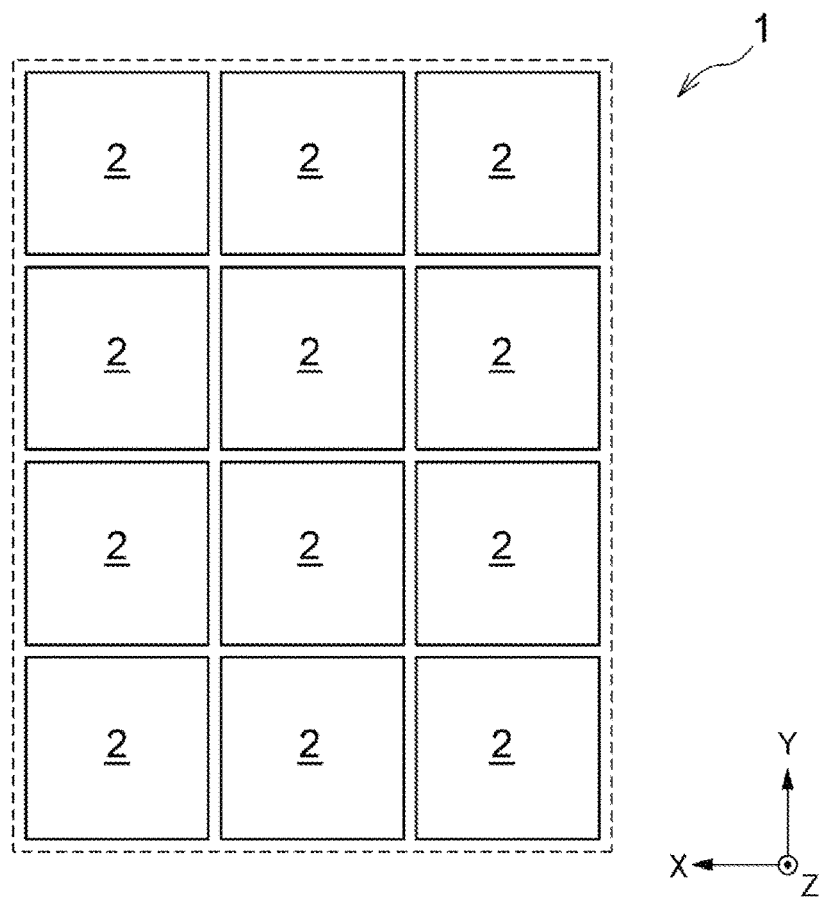
FIG. 1 is a plan view showing a schematic configuration of a part of a memory cell region of a semiconductor device according to an embodiment.
Figure 1A:
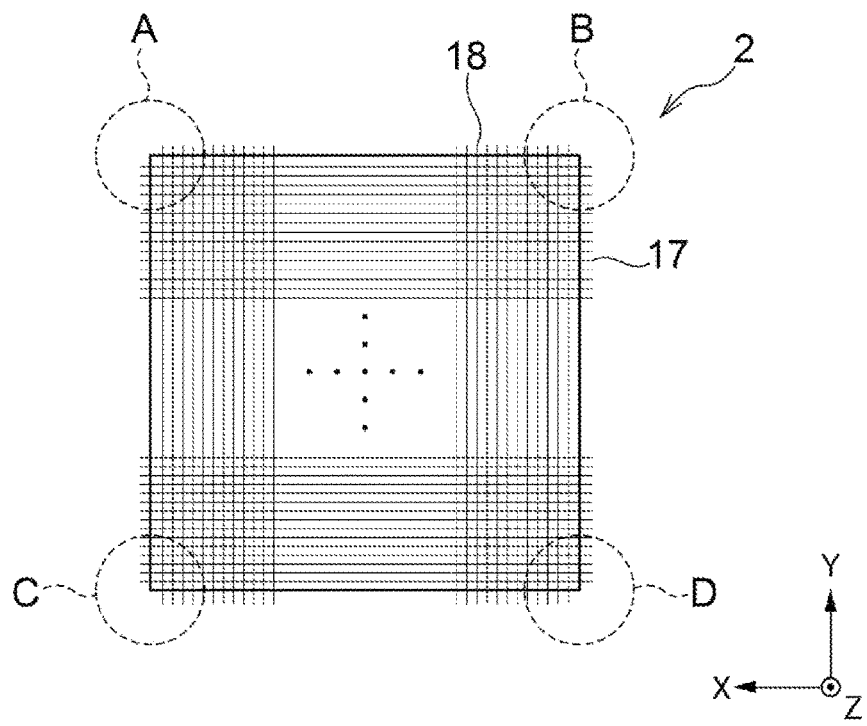
FIG. 1A is a plan view showing a schematic configuration of a memory mat.

FIG. 1 and FIG. 1A are schematic diagrams showing a planar layout of the semiconductor device according to the embodiment. As shown in FIG. 1, the semiconductor device includes a plurality of memory mats 2 arranged in a matrix form on the surface of a semiconductor substrate. Each memory mat 2 has a rectangular shape in a plan view. As shown in FIG. 1A, each memory mat includes a plurality of word lines 18 which are arranged in parallel so as to extend in the Y direction in FIG. 1A.

Each memory mat 2 further includes a plurality of bit lines 17 which are arranged in parallel so as to be orthogonal to the word lines 18, that is, so as to extend in the X direction in FIG. 1A. The direction parallel to the word lines 18, that is, the Y direction is referred to as a word-line direction. The direction parallel to the bit lines 17, that is, the X direction is referred to as a bit line direction.

Each word line 18 is connected to a row decoder (not shown) on a peripheral portion thereof. A row address to be selected at the time of reading/writing from/into a memory cell is input from a row address buffer (not shown) into the row decoder. Each of the plurality of word lines 18 is paired with a corresponding one of a plurality of memory cells to control access to a plurality of corresponding memory cells among the plurality of memory cells.

Each bit line 17 is connected to a column decoder (not shown) on a peripheral portion thereof. A column address to be selected at the time of reading/writing from/into a memory cell is input from a column address buffer (not shown) into the column decoder. Each of the plurality of bit lines 17 is paired with a corresponding one of the plurality of memory cells to control access to a plurality of corresponding memory cells among the plurality of memory cells.

The configurations of regions A, B, C, and D which are the four corners of the memory mat 2, are substantially the same, and are in a line-symmetrical relationship with one another in the X direction or the Y direction. FIGS. 3 to 13 show a schematic configuration in region A.

Figure 2:
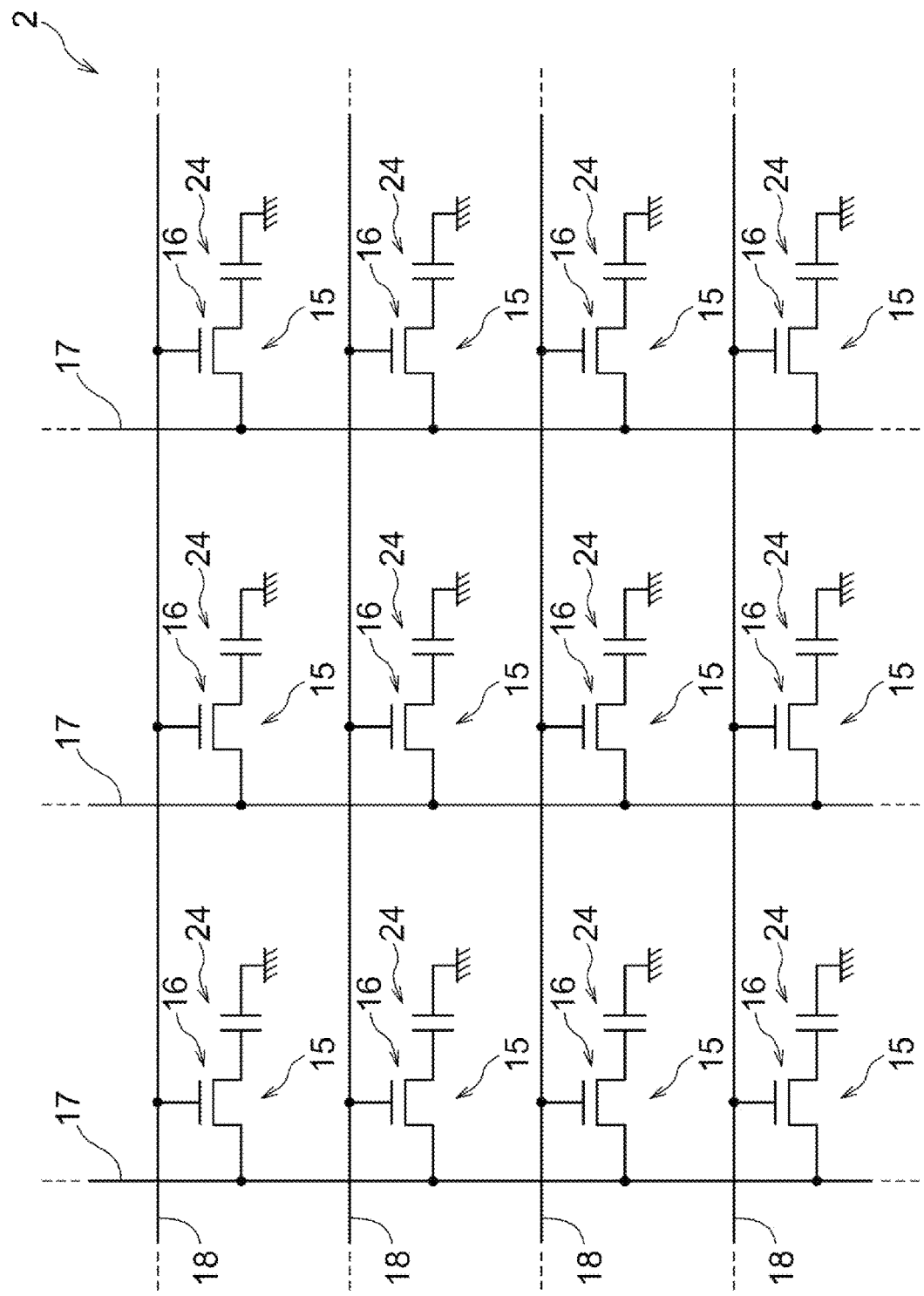
FIG. 2 is a circuit diagram showing a schematic configuration of an equivalent circuit of a memory cell of the semiconductor device according to an embodiment.

FIG. 2 shows an equivalent circuit of the memory cell array of the semiconductor device according to the embodiment. The plurality of memory cells 15 are arranged in a matrix form so as to connect to the intersections between the plurality of word lines 18 and the plurality of bit lines 17 which are arranged so as to intersect each other at orthogonal angles. Each memory cell 15 includes a pair of an access transistor 16 and a storage capacitor 24.

The access transistor 16 includes, for example, a MOSFET (metal-oxide-semiconductor field-effect transistor). The word line 18 functions as a gate electrode of the access transistor 16. The word line 18 also functions as a control line for controlling the selection of the corresponding memory cell. One of the source and drain of the access transistor 16 is connected to the bit line 17, and the other is connected to the storage capacitor 24. The storage capacitor 24 includes a capacitor, and data is stored by accumulating electric charges in the capacitor.

When data is written into the memory cell 15, a potential for turning on the access transistor 16 is applied to the word line 18, and a low potential or high potential corresponding to writing data "0" or "1" is applied to the bit line 17. When data is read out from the memory cell 15, a potential for turning on the access transistor 16 is applied to the word line 18. As a result, a potential drawn from the storage capacitor 24 to the bit line 17 is sensed by a sense amplifier connected to the bit line 17, thereby performing determination on the data.

The schematic configuration of the semiconductor device 1 according to the embodiment will be described hereunder. The description on a region A will be made hereunder.

Figure 3:
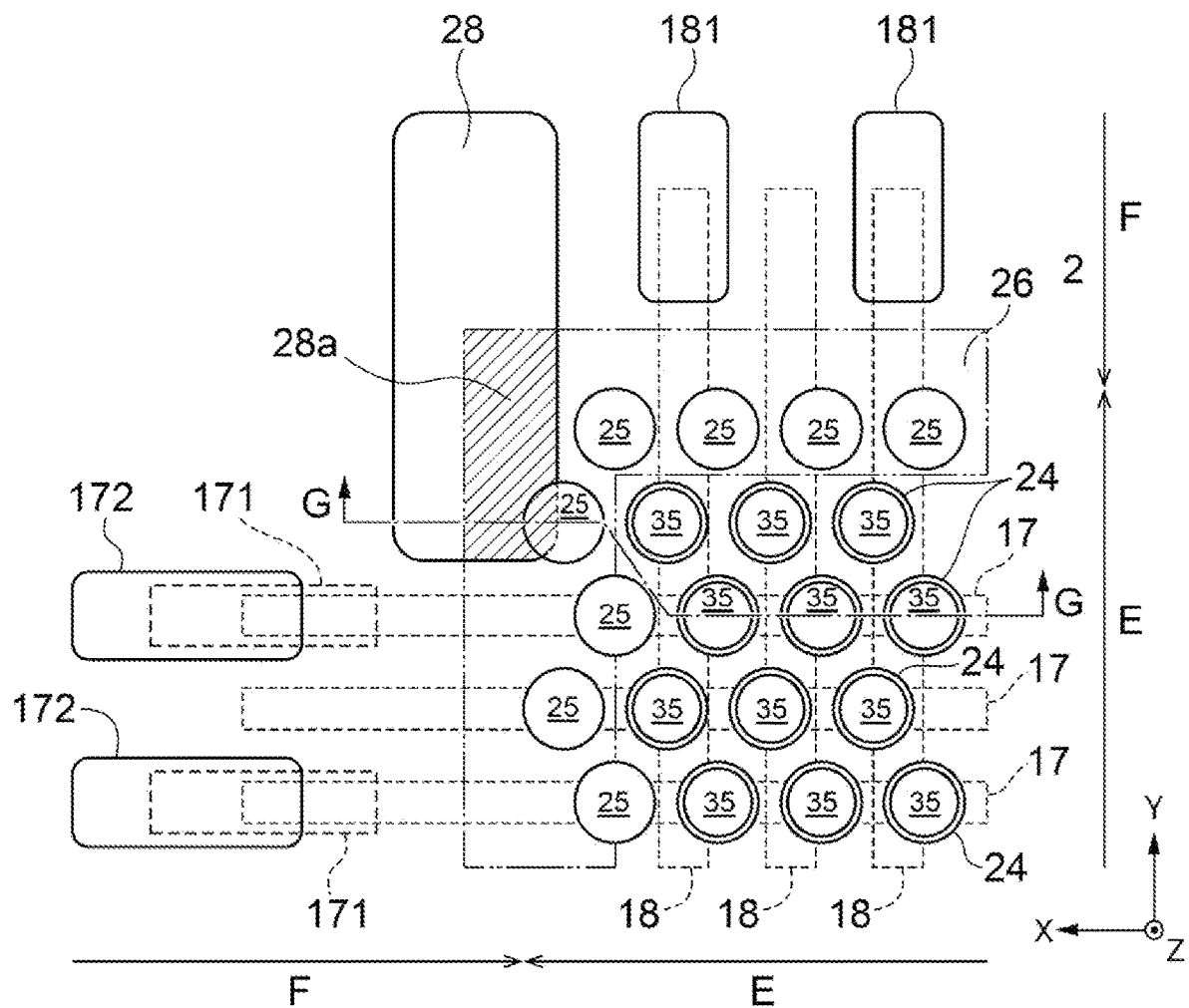
FIG. 3 is a plan view showing a schematic configuration of the semiconductor device according to the embodiment.

FIG. 3 is a plan view showing a layout of the semiconductor device 1 according to the embodiment. As shown in FIG. 3, the semiconductor device 1 includes a memory cell region E and a peripheral region F surrounding the memory cell region E. Storage capacitors 24 and dummy capacitors 25 are arranged in a matrix form in the memory cell region E. The storage capacitors 24 have the ability to actually store electric charges. The dummy capacitors 25 do not have the ability to actually store electric charges, or they mean capacitor structures that are not connected to any memory node. Assuming a case in which patterning uniformity is lost at the end portion of the memory cell region E, dummy capacitors 25 that do not function as capacitors of DRAM are arranged on the outermost periphery of the memory cell region E.

As shown in FIG. 3, in the semiconductor device 1, the plurality of word lines 18 arranged in parallel so as to extend in the Y direction. The plurality of bit lines 17 are arranged in parallel so as to extend in the X direction. The plurality of bit lines 17 and the plurality of word lines 18 are arranged so as to be orthogonal to each other. The tip portions of the bit lines 17 are connected to second extraction electrodes 172 via first extraction electrodes 171 in the peripheral region F, respectively. The second extraction electrodes 172 are connected to the column decoder (not shown). The tip portions of the word lines 18 are connected to third extraction electrodes 181 in the peripheral region F. The third extraction electrodes 181 are connected to the row decoder (not shown).

At the peripheral portion of the memory cell region E, the dummy capacitors 25 are arranged above an upper landing pad 26 so as to overlap the upper landing pad 26 in the vertical direction. The upper landing pad 26 is arranged so as to surround an outer periphery of an aggregate of the storage capacitors 24 in a plan view, and forms a ring-shaped ring wiring as a whole. The upper landing pad 26 includes an overlap portion 28a in the vicinity of a corner portion of the memory mat 2 in the memory cell region E. The upper landing pad 26 is connected to a fourth extraction electrode 28 at the overlap portion 28a.

Figure 4:
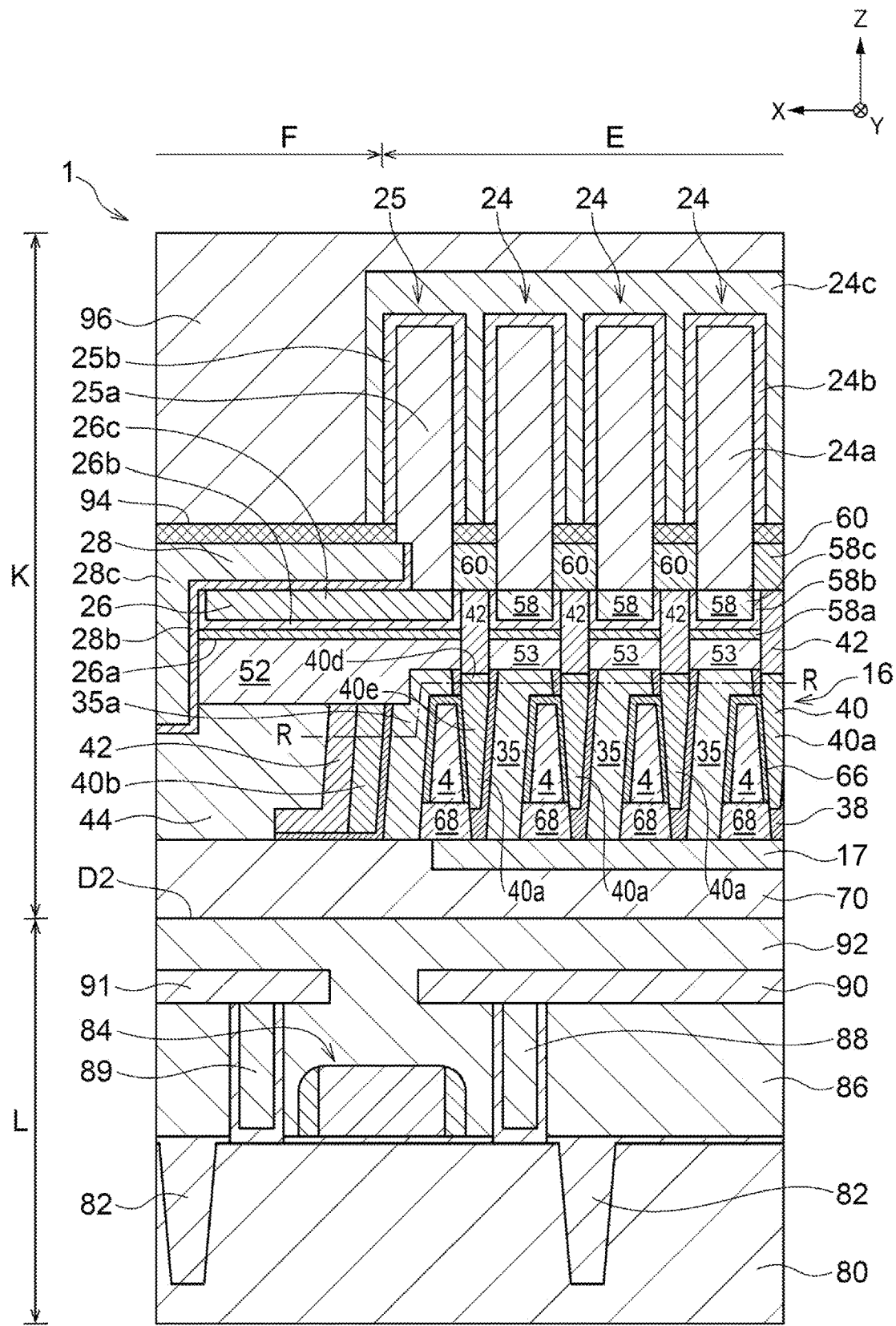
FIG. 4 is a diagram showing a schematic configuration of the semiconductor device according to an embodiment, and also is a vertical cross-sectional view showing a schematic configuration of a portion taken along a G-G line of FIG. 3.

The dummy capacitors 25 are arranged on the upper landing pad 26 and the fourth extraction electrode 28. At the overlap portion 28a, at least parts of the upper landing pad 26, the fourth extraction electrode 28, and the dummy capacitor 25 are arranged so as to overlap one another in the Z direction as shown in FIGS. 3 and 4. The fourth extraction electrode 28 is an electrode for extracting the potential of the upper landing pad 26 to the outside, and serves as a power supply wiring connected to a predetermined potential through a wiring (not shown).

Figure 3A:
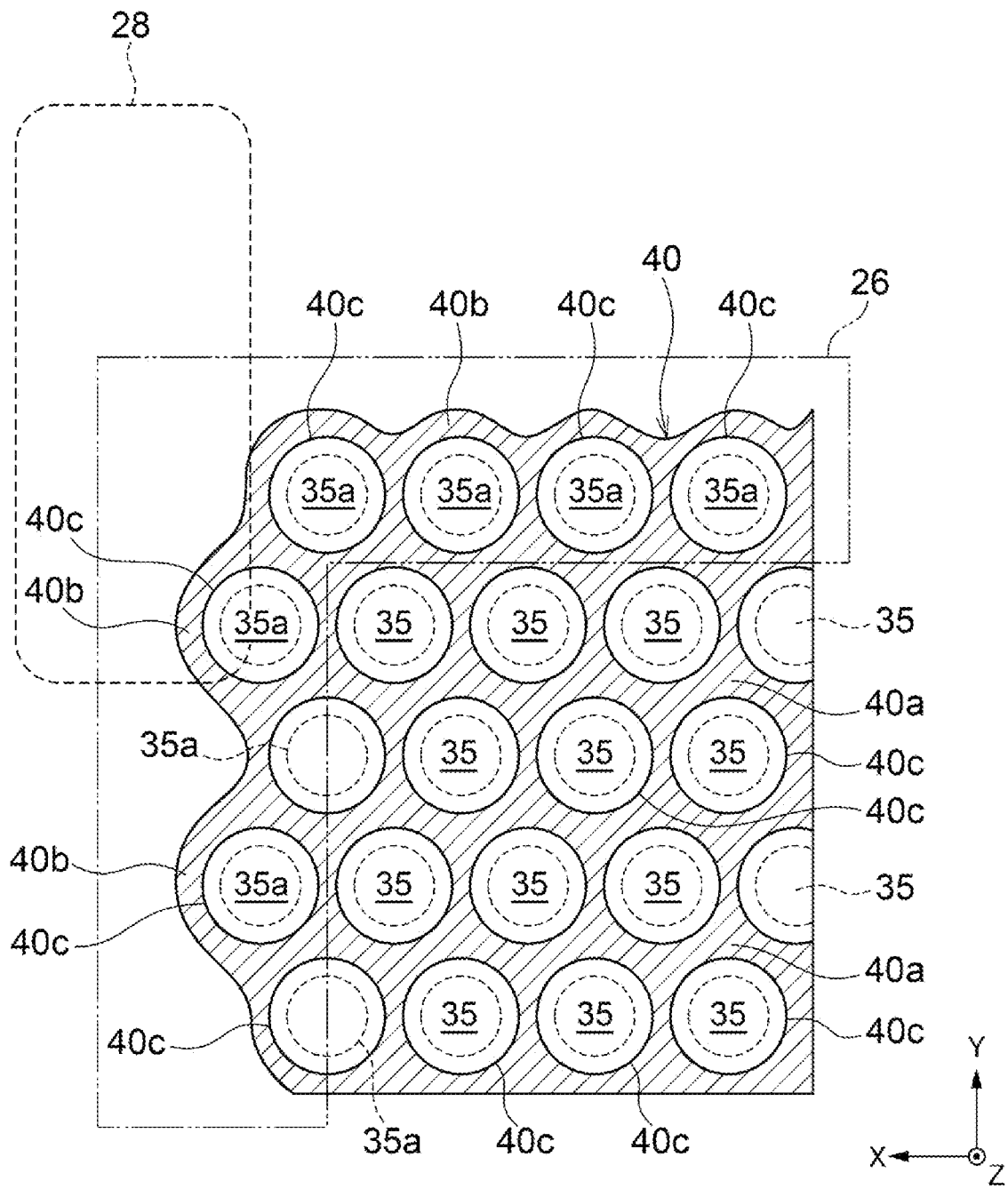
FIG. 3A is a diagram which shows a schematic configuration of the semiconductor device according to an embodiment and also shows a schematic configuration of a shield structure taken along an R-R line of FIG. 4.

FIG. 3A is a diagram showing a schematic configuration of channel pillars 35, peripheral pillars 35a, and a shield structure 40, which is taken along an R-R line of FIG. 4. As shown in FIG. 3A, the upper landing pad 26 is connected to the shield structure 40 at an edge region of the shield structure 40. The shield structure 40 includes a center shield structure 40a and an outer peripheral shield structure 40b.

The center shield structure 40a is arranged in the central portion of the memory mat 2, and is arranged among the plurality of channel pillars 35 and peripheral pillars 35a. The outer peripheral shield structure 40b is arranged so as to surround the peripheries of the plurality of peripheral pillars 35a. The shield structure 40 includes opening holes 40c each of which surrounds each of the channel pillars 35 and the peripheral pillars 35a, and is arranged in a mesh pattern as a whole. No boundary exists between the center shield structure 40a and the outer peripheral shield structure 40b, and they are integrally connected to each other. A third insulating film 42 is provided in a side-surface direction of the outer peripheral shield structure 40b, and a fourth insulating film 44 is further arranged.

As shown in FIG. 4, the semiconductor device 1 according to the present embodiment includes a first structure K and a second structure L. The first structure K and the second structure L are laminated in the Z direction, that is, in the vertical direction. The first structure K and the second structure L are joined to each other at a joint surface D2. The first structure K includes the bit lines 17, the access transistors 16, the storage capacitors 24, and an eleventh insulating film 96 which are laminated in this order on a seventh insulating film 70. The source and drain of the access transistor 16 are electrically connected to a lower electrode 24a of the corresponding storage capacitor 24. The eleventh insulating film 96 covers the upper surface of the semiconductor device 1. The seventh insulating film 70 and the eleventh insulating film 96 contain an insulating material, and contain, for example, silicon dioxide ($SiO_2$).

In the memory cell region E, the access transistor 16 includes a gate electrode 4 and a channel pillar 35. The gate electrode 4 is adjacent to and faces the channel pillar 35 and the center shield structure 40a through a second insulating film 38. The second insulating film 38 functions as a gate insulating film of the access transistor 16. The channel pillar 35 extends in a direction perpendicular to a second semiconductor substrate 80. The channel pillar 35 functions as a channel portion of the access transistor 16. The access transistor 16 is configured as a vertical memory cell transistor in which a channel extends in the Z direction, that is, in the vertical direction. The channel pillar 35 is surrounded by an insulating film except for connection portions thereof with the bit line 17 and a lower pad 53. The access transistor 16 functions as a full depletion or partial depletion type silicon on insulator (SOI) transistor. In a portion including neither the channel pillar 35 nor the peripheral pillar 35a, that is, in a region between the channel pillar 35 and the peripheral pillar 35a, the side and upper portions of the gate electrode 4 are surrounded by the shield structure 40. The shield structure 40 includes a main surface portion 40d that surrounds the top portions of the channel pillars 35 of the access transistors 16, and vertically extending portions 40e each formed adjacently to a corresponding one of the gate electrodes 4 of the access transistors 16.

The shield structure 40 is connected to a predetermined potential, and functions as an isolation for electrically separating the adjacent access transistors 16 from each other. The third insulating film 42 is arranged on the center shield structure 40a. The third insulating film 42 includes, for example, silicon nitride (SiN). The gate electrode 4 contains a conductive material, for example, titanium nitride (TiN).

The bit lines 17 shown in FIG. 3 contain a conductive material, and includes, for example, tungsten (W).

In the memory cell region E, the storage capacitor 24 includes a lower electrode 24a, a capacitive insulating film 24b, and an upper electrode 24c. The capacitive insulating film 24b is sandwiched between the lower electrode 24a and the upper electrode 24c. The lower electrode 24a of each storage capacitor 24 is connected to a pedestal portion 58, and the pedestal portion 58 is connected to the corresponding channel pillar 35 via the lower pad 53. The bit line 17 is connected to an opposite side of each channel pillar 35 to the lower pad 53. The bit line 17 and the lower pad 53 function as the source and drain of the access transistor 16. The pedestal portion 58 includes a silicide 58a, a barrier metal 58b, and a metal film 58c. The lower portion of the metal film 58c is connected to the lower pad 53. The upper portion of the metal film 58c is connected to the lower electrode 24a. The barrier metal 58b covers the side and lower surfaces of the metal film 58c, and is sandwiched between the silicide 58a and the metal film 58c.

In the memory cell region E, the dummy capacitor 25 includes a dummy lower electrode 25a, a dummy capacitive insulating film 25b, and an upper electrode 24c. The dummy lower electrode 25a of each dummy capacitor 25 is connected to the fourth extraction electrode 28, and the upper landing pad 26. A lower landing pad 52 is arranged below the upper landing pad 26 so as to be in contact with the upper landing pad 26. The fourth extraction electrode 28 includes an upper barrier metal 28b. The fourth extraction electrode 28 is in contact with the upper and side surfaces of the upper landing pad 26 and the side surface of the lower landing pad 52 via the upper barrier metal 28b.

The upper landing pad 26 is connected to the peripheral pillars 35a and the outer peripheral shield structure 40b via the lower landing pad 52. The upper landing pad 26 includes a peripheral silicide 26a, a peripheral barrier metal 26b, and a peripheral metal film 26c. The upper landing pad 26 and the lower landing pad 52 are electrically connected to each other to form an integrated landing pad. The lower landing pad 52 is not connected to the bit lines 17. Therefore, the dummy capacitors 25 are not electrically connected to the bit lines 17.

The upper landing pad 26 is connected to the lower landing pad 52. The peripheral metal film 26c is connected to the dummy lower electrodes 25a. The peripheral barrier metal 26b covers the side and lower surfaces of the peripheral metal film 26c, and is sandwiched between the peripheral silicide 26a and the peripheral metal film 26c. Since the peripheral pillars 35a are not connected to the bit lines 17, the dummy capacitors 25 which are electrically connected to the peripheral pillars 35a do not function as DRAM capacitors.

The second structure L includes the second semiconductor substrate 80, an isolation 82 provided on the second semiconductor substrate 80, a peripheral circuit transistor 84 provided on the second semiconductor substrate 80, an eighth insulating film 86, contacts 88 and 89, a wiring 90 and a ninth insulating film 92 covering these elements.

Next, a method of manufacturing the semiconductor device 1 according to the embodiment will be described with reference to FIGS. 4 to 13.

Figure 5:
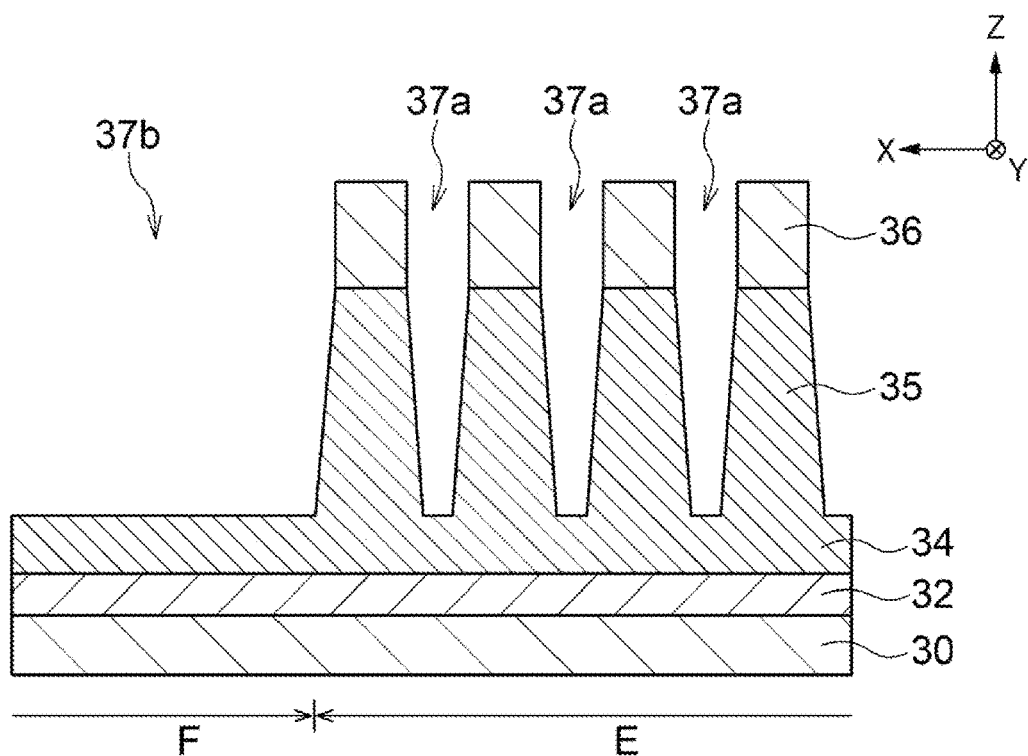

First, as shown in FIG. 5, a first semiconductor layer 32, a second semiconductor layer 34, and a first insulating film 36 are laminated on a first semiconductor substrate 30 to form a film. A memory cell region E and a peripheral region F are provided on the first semiconductor substrate 30.

The first semiconductor substrate 30 includes, for example, a disk-shaped single crystal silicon wafer having a mirror-finished principal plane. The first semiconductor layer 32 contains, for example, silicon germanium (SiGe). A film of silicon germanium is formed, for example, by an epitaxial growth technique. This silicon germanium is formed so that the content of germanium (Ge) is equal to 20% to 30%, for example.

The second semiconductor layer 34 contains, for example, silicon (Si). The second semiconductor layer 34 is formed, for example, by an epitaxial growth technique. The first insulating film 36 includes, for example, silicon nitride. The first insulating film 36 is formed, for example, by a chemical vapor deposition (hereinafter referred to as CVD technique).

Next, the first insulating film 36 is etched by using a known lithography technique and a known anisotropic dry etching technique, and then the second semiconductor layer 34 is etched halfway. An etching mask (not shown) formed by the lithography technique has a pattern similar to that of the storage capacitors 24 and the dummy capacitors 25 shown in FIG. 3. This etching step provides a laminated structure including a plurality of island-shaped channel pillars 35 and the first insulating film 36 formed thereon, which extend in a direction perpendicular to the first semiconductor substrate 30, that is, in the Z direction. The channel pillar 35 and the first insulating film 36 form a pillar-shaped island-like structure.

In the memory cell region E, a gap 37a is formed between the adjacent pillar-shaped island-like structures. A recess portion 37b is formed in the peripheral region F. The channel pillars 35 are formed in the memory cell region E. The first insulating films 36 is laminated on each of the channel pillars 35.

Figure 6:
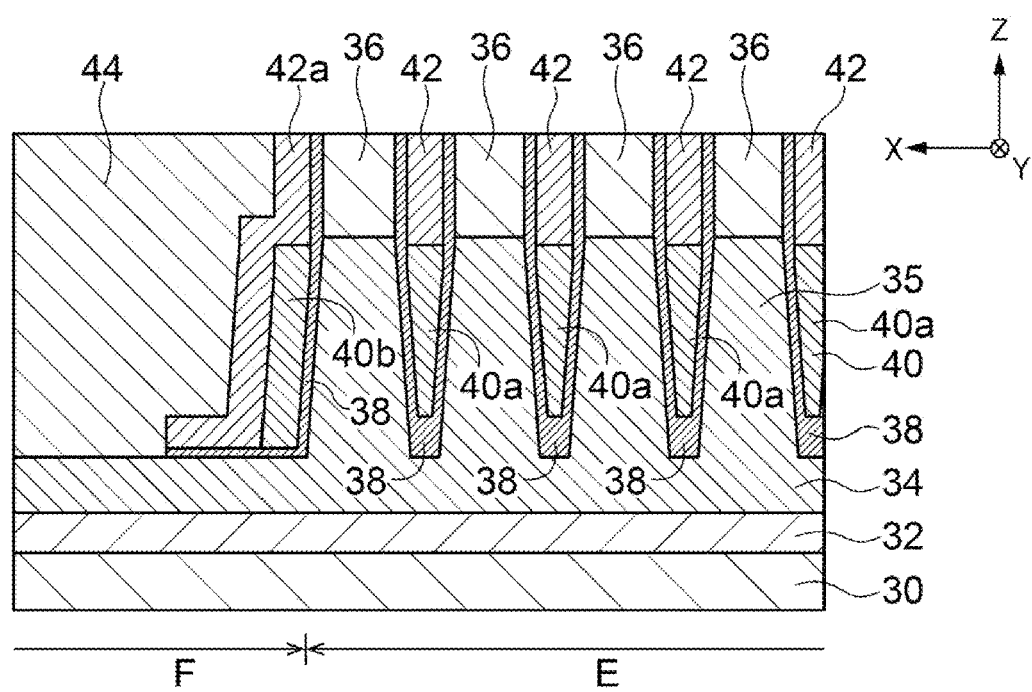

Next, as shown in FIG. 6, the second insulating film 38, the center shield structure 40a, and the third insulating film 42 are formed in the gaps 37a of the memory cell region E. Further, the outer peripheral shield structure 40b, a side insulating film 42a, and the fourth insulating film 44 are also formed in the vicinity of the boundary between the memory cell region E and the peripheral region F. The outer peripheral shield structure 40b is formed around the memory cell region E. The second insulating film 38 and the fourth insulating film 44 contain, for example, silicon dioxide. The shield structure 40 includes a conductive material, and includes, for example, polysilicon (poly-Si) doped with phosphorus (P) or arsenic (As) as an impurity.

The shield structure 40 is surrounded by the second insulating film 38. The second insulating film 38, the shield structure 40, the third insulating film 42, and the fourth insulating film 44 are formed as follows. First, the second insulating film 38 and polysilicon are formed in order by using the CVD technique. The second insulating film 38 and polysilicon are formed in the gaps 37a in the memory cell region E and on the first insulating film 36. Further, the second insulating film 38 and polysilicon are formed on the side surface and the bottom surface of the recess portion 37b in the peripheral region F.

Next, the polysilicon is etched back by using anisotropic dry etching. The etch-back of the polysilicon is carried out under a condition that the etching rate of polysilicon is larger than the etching rate of silicon dioxide. Etch-back of the polysilicon is carried out until polysilicon on the first insulating film 36 has been removed and further polysilicon on the upper portions of the gaps 37a has been removed. The etch-back of the polysilicon causes the polysilicon remaining in the gaps 37a to serve as the center shield structure 40a. The polysilicon remaining at the step of the boundary between the memory cell region E and the peripheral region F serves as the outer peripheral shield structure 40*b*.

Next, in the memory cell region E, a silicon nitride film is formed in grooves formed by removing the polysilicon on the upper portions of the gaps 37*a* and on the first insulating film 36. In the peripheral region F, silicon nitride is formed so as to cover the upper surface of the second semiconductor layer 34, the upper surface of the outer peripheral shield structure 40*b*, and the side surface of the second insulating film 38.

Next, the silicon nitride is etched back by using anisotropic dry etching. The etch-back of the silicon nitride is carried out under a condition that the etching rate of silicon nitride is larger than the etching rate of the second semiconductor layer 34, that is, silicon. The etch-back of the silicon nitride is carried out until silicon nitride on the first insulating film 36 in the memory cell region E and silicon nitride on the outer peripheral shield structure 40*b* and the second semiconductor layer 34 in the peripheral region F have been removed. The etch-back of the silicon nitride causes the silicon nitride remaining in the gaps 37*a* to serve as the third insulating film 42. The silicon nitride remaining at the step of the boundary between the memory cell region E and the peripheral region F serves as the side insulating film 42*a*.

Next, in the peripheral region F, the recess portion 37*b* is filled with an insulating material to form the fourth insulating film 44. The fourth insulating film 44 is formed by forming, for example, a silicon dioxide film in the memory cell region E and the peripheral region F by the CVD technique, and then performing etch-back using anisotropic dry etching. A structure shown in FIG. 6 is formed by the above-described steps.

Figure 7:
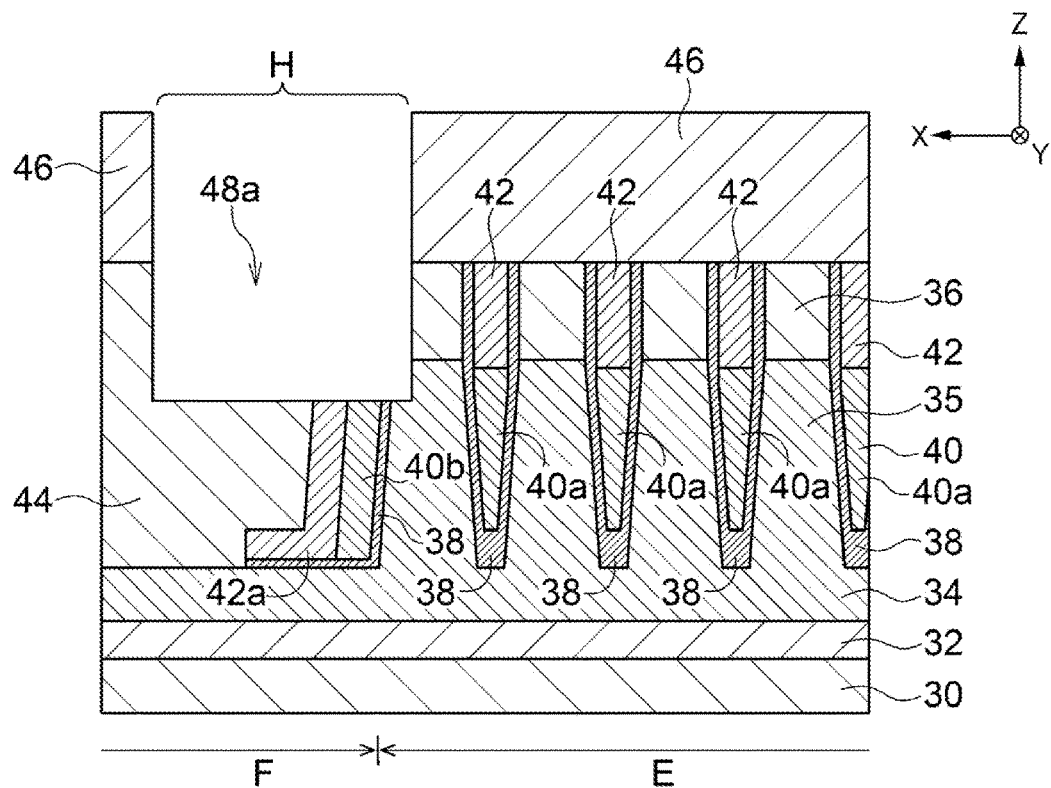

Next, as shown in FIG. 7, a first resist 46 which covers the memory cell region E and the peripheral region F excluding a cell end region H is formed by using the known lithography technique. The cell end region H includes a boundary between the memory cell region E and the peripheral region F. Next, the first resist 46 is used as a mask to perform etching on the cell end region H by using the known anisotropic dry etching technique, thereby forming a recess portion 48*a*. This etching is performed under a condition that the etching rates of silicon dioxide, silicon nitride, and polysilicon are substantially the same.

Figure 8:
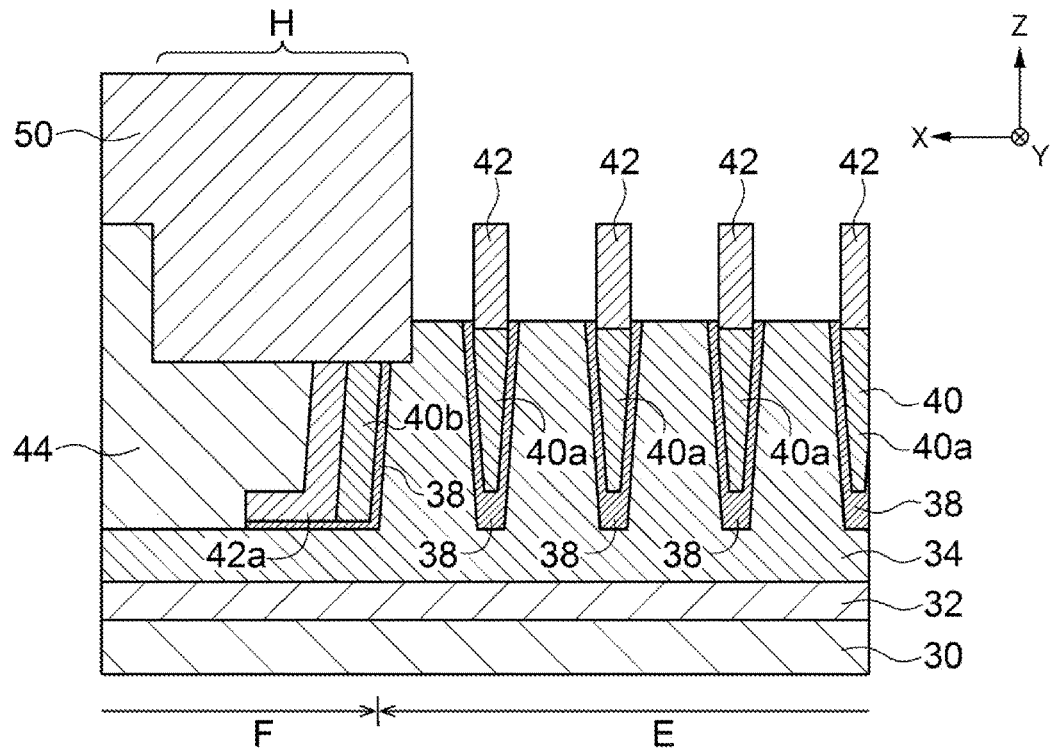

Next, as shown in FIG. 8, after removing the first resist 46, a second resist 50 which covers the cell end region H and the peripheral region F is formed by using the known lithography technique. Next, the second resist 50 is used as a mask to perform wet etching using buffered hydrofluoric acid (hereinafter referred to as BHF), and the first insulating film 36 and the second insulating film 38 of the memory cell region E are removed until the top surfaces of the channel pillars 35 are exposed.

In the etching using BHF, the etching rate of silicon dioxide is higher than the etching rates of silicon and silicon nitride, so that it is possible to selectively remove silicon dioxide. Instead of the wet etching, dry etching may be performed under a condition that the etching rate of silicon dioxide is higher than the etching rates of silicon and silicon nitride. As a result, a structure in which the third insulating film 42 protrudes from the surface of the second semiconductor layer 34 is formed in the memory cell region E.

Figure 9:
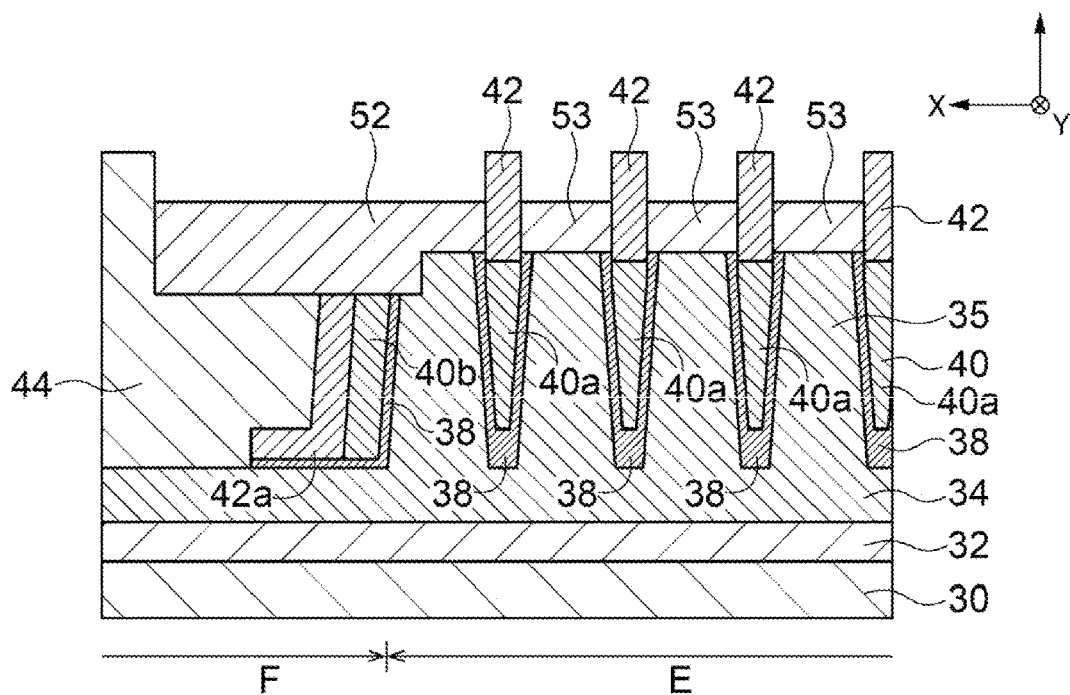

Next, as shown in FIG. 9, after removing the second resist 50, polysilicon is formed on the surface including the memory cell region E and the peripheral region F. Polysilicon is formed, for example, by the CVD technique. Next, etch-back using anisotropic dry etching is performed. As a result, the upper portions of the third insulating film 42 and the fourth insulating film 44 are exposed. The polysilicon is doped with an impurity such as phosphorus or arsenic to form n-type polysilicon. This etch-back adopts a condition that the etching rate of polysilicon is higher than the etching rates of silicon nitride and silicon dioxide.

This etch-back causes the remaining polysilicon to serve as the lower landing pad 52 in the peripheral region F and serve as the lower pad 53 in the memory cell region E. The upper surface of the lower landing pad 52 and the upper surface of the lower pad 53 are lower than the upper surface of the third insulating film 42, so that recess portions are formed on the lower landing pad 52 and the lower pad 53.

Figure 10:
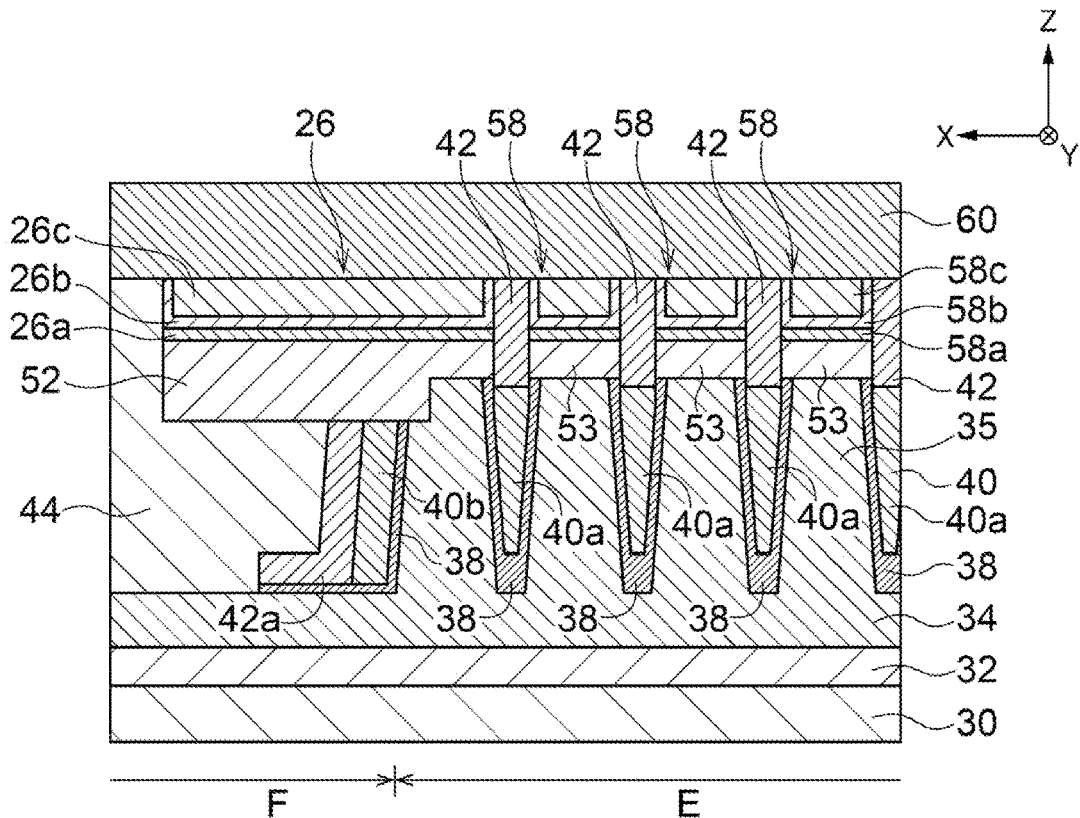

Next, as shown in FIG. 10, a metal film is formed in the recess portions on the lower landing pad 52 and the lower pad 53, and subjected to a heat treatment to be reacted with the lower landing pad 52 and the lower landing pad 52, thereby forming metal silicide. The metal film can be formed, for example, by using a CVD technique or a sputtering technique. Peripheral silicide 26*a* is formed on the lower landing pad 52 in the peripheral region F. Silicide 58*a* is formed on the lower pad 53 in the memory cell region E. For example, cobalt (Co) or titanium (Ti) can be used for the metal film to be formed. For example, cobalt silicide (CoSi) or titanium silicide (TiSi) is formed as the metal silicide.

Next, a barrier metal film and a metal film are formed in the recess portions on the peripheral silicide 26*a* and on the silicide 58*a*, and on the third insulating film 42 and the fourth insulating film 44, and subsequently, the barrier metal film and the metal film are subjected to chemical mechanical polishing (hereinafter referred to as CMP) until the upper surfaces of the third insulating film 42 and the fourth insulating film 44 are exposed. Etch-back using anisotropic dry etching may also be performed instead of CMP. For example, titanium nitride can be used as the barrier metal. Tungsten can be used as the metal. A titanium nitride film and a tungsten film are formed by using the CVD technique.

This CMP causes the titanium nitride and tungsten remaining in the recess portion on the peripheral silicide 26*a* to serve as the upper landing pad 26. Further, the CMP causes the titanium nitride and tungsten remaining in the recess portions on the silicide 58*a* in the memory cell region E to serve as the pedestal portions 58. The upper landing pad 26 includes the peripheral barrier metal 26*b* and the peripheral metal film 26*c*. The pedestal portion 58 includes the barrier metal 58*b* and the metal film 58*c*. The upper barrier metal 28*b* and the barrier metal 58*b* include titanium nitride. The peripheral metal film 26*c* and the metal film 58*c* include tungsten. The upper landing pad 26 and the pedestal portions 58 include the same material. The lower landing pad 52 and the lower pad 53 include the same material.

Next, a fifth insulating film 60 is formed so as to cover the third insulating film 42, the fourth insulating film 44, the upper landing pad 26, and the upper portions of the pedestal portions 58. The fifth insulating film 60 includes, for example, silicon nitride. The fifth insulating film 60 can be formed, for example, by the CVD technique. A structure shown in FIG. 10 is formed by the above steps.

Figure 11:
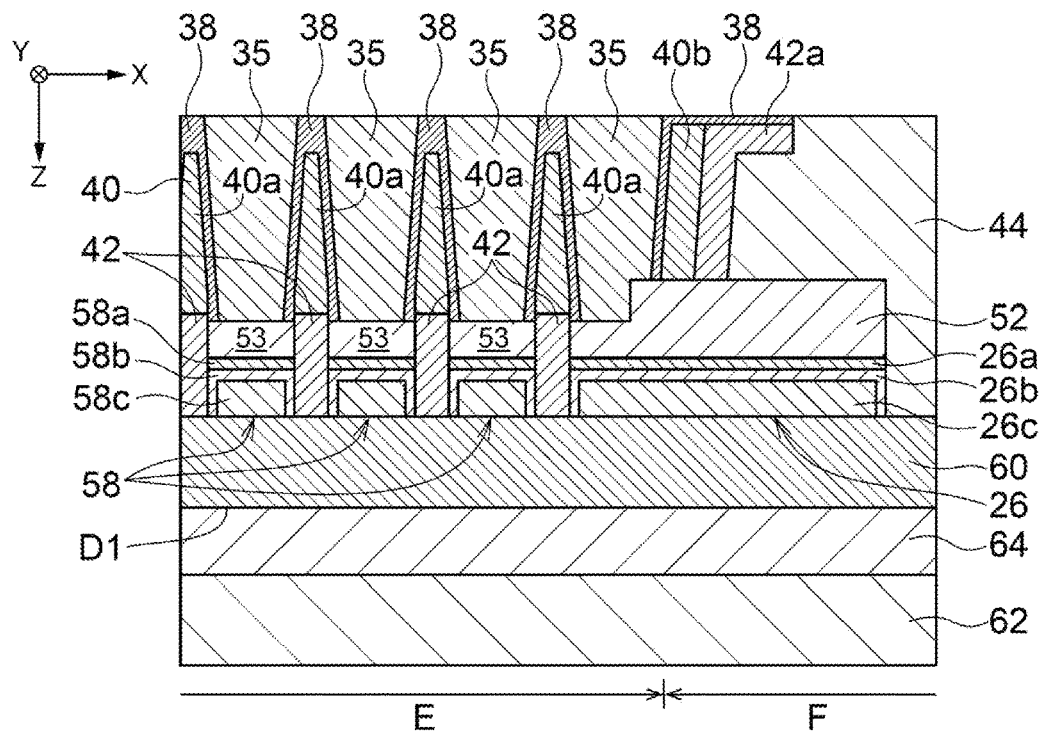

Next, as shown in FIG. 11, the first semiconductor substrate 30 is rotated along the X axis with the Y axis as the rotation center by 180 degrees. Subsequently, according to a wafer bonding technique, the first semiconductor substrate 30 containing the fifth insulating film 60 is bonded to a first support substrate 62 having a sixth insulating film 64 formed in advance thereon at a joint surface D1. At the joint surface D1, the surface of the fifth insulating film 60 and the surface of the sixth insulating film 64 are in contact with each other.

In the wafer bonding technique, for example, a fusion bonding technique can be used. The fusion bonding technique first performs a treatment of adhering a large number of hydroxyl groups onto the surfaces of the first support substrate 62 having the sixth insulating film 64 formed thereon and the first semiconductor substrate 30 having the fifth insulating film 60 formed thereof, that is, perform a hydrophilic treatment. Next, both the hydrophilized surfaces are superimposed and bonded to each other. The bonding based on the fusion bonding technique is established by hydrogen bonds between hydroxyl groups on the hydrophilized surfaces. The bonding based on the fusion bonding technique can be performed at room temperature.

At this time, the first support substrate 62 and the first semiconductor substrate 30 are superimposed and laminated while performing positioning. The positioning is performed, for example, by forming alignment marks (not shown) in advance on the first support substrate 62 and the first semiconductor substrate 30 and detecting the alignment marks. Another bonding method may also be used as the wafer bonding technique.

Next, the first semiconductor substrate 30 and the first semiconductor layer 32 are removed. The first semiconductor substrate 30 and the first semiconductor layer 32 can be removed by performing backside polishing on the first support substrate 62 and then performing dry etching, a CMP technique and wet etching. This dry etching may be performed under either an anisotropic condition or an isotropic condition.

The wet etching is performed, for example, by using a mixed liquid of triethylmethylammonium (referred to as TEMA) and aqueous ammonia as an etching solution. The wet etching using this etching solution is performed so as to stop at the surface of the first semiconductor layer 32 containing silicon germanium after the first support substrate 62 is etched. Next, the first semiconductor substrate 30 and the first semiconductor layer 32 are removed by using a dry etching technique. This dry etching may be performed under either an anisotropic condition or an isotropic condition. Thereafter, the second semiconductor layer 34 is removed by using the CMP technique to expose the back surface of the second insulating film 38. A structure shown in FIG. 11 is formed by the above steps.

Figure 12:
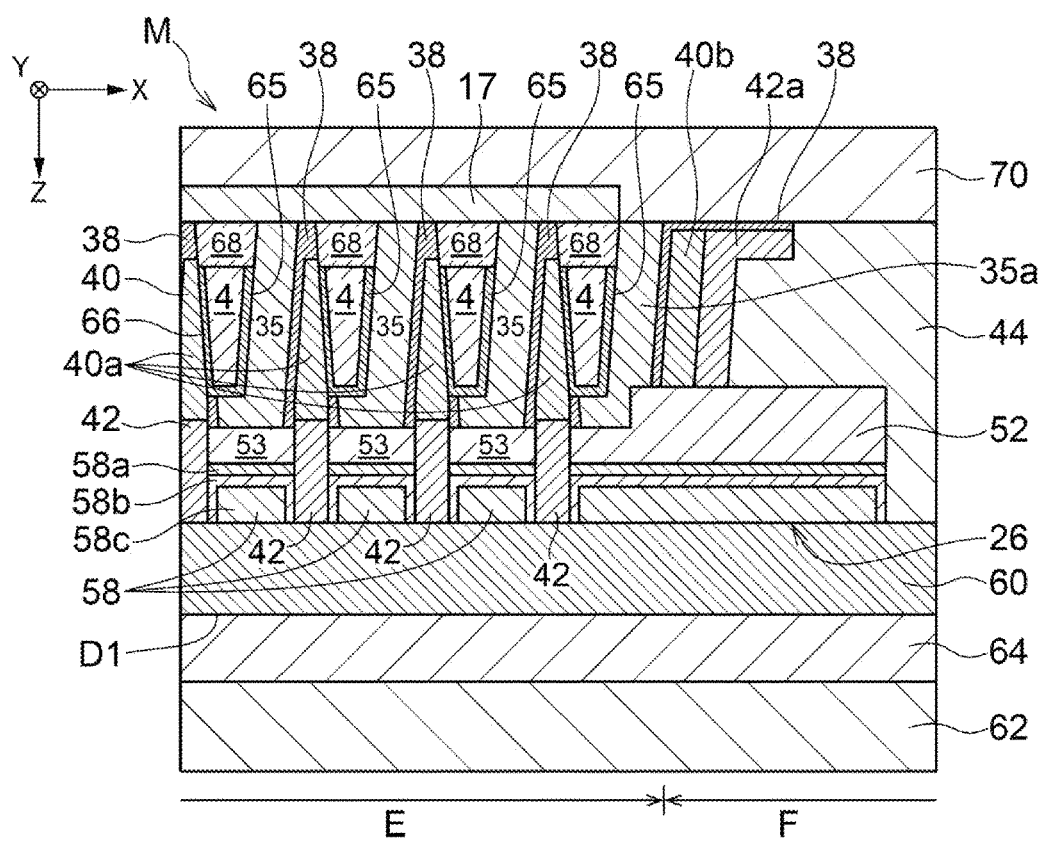

Next, as shown in FIG. 12, a plurality of gate grooves 65 are formed in the center shield structure 40a of the memory cell region E so as to be in contact with the second insulating film 38. The plurality of gate grooves 65 extend in the Y direction and are arranged in parallel at predetermined intervals. Further, the gate grooves 65 are formed by using the known lithography technique and the known anisotropic dry etching technique. The gate grooves 65 are formed so as to extend in the Z direction, and are formed in such a depth that they do not reach the lower landing pad 52 and the lower pad 53.

Next, a gate insulating film 66 and a gate electrode 4 are formed in each of the gate grooves 65. The gate insulating film 66 contains, for example, silicon dioxide. The gate electrode 4 contains a conductive material, for example, titanium nitride. The gate electrode 4 is surrounded by the gate insulating film 66. With respect to the gate insulating film 66 and the gate electrode 4, for example, silicon dioxide and titanium nitride are formed in the gate grooves 65 by the CVD technique, and then etch-back is performed by the anisotropic dry etching.

Thereafter, silicon dioxide is embedded in recess portions formed on the gate electrodes 4 by etch-back, and etch-back is further performed to the extent that the channel pillars 35 and the fourth insulating film 44 are exposed by removing silicon nitride on the channel pillars 35 and the fourth insulating film 44. As a result, a cap insulating film 68 is formed on the gate electrodes 4. In this way, the gate electrodes 4 can be formed so as to face and contact the side surfaces of the channel pillars 35 serving as channel regions via the gate insulating film 66.

A metal film is formed on the upper surfaces of the channel pillars 35, the second insulating film 38, the cap insulating film 68, and the fourth insulating film 44. The metal film includes, for example, one of tungsten silicide (WSi), tungsten nitride (WN), and tungsten (W). The metal film is formed, for example, by the CVD technique. Thereafter, this metal film is patterned by using the known lithography technique and the known anisotropic dry etching technique to form the bit lines 17. The bit lines 17 are formed so as to be in contact with the upper surfaces of the channel pillars 35 in the memory cell region E. The bit lines 17 are formed so as not to be connected to the upper surfaces of the peripheral pillars 35a in the peripheral region F. The plurality of bit lines 17 extends in parallel to the X direction.

Next, a seventh insulating film 70 is formed so as to cover the bit lines 17, the channel pillars 35, the second insulating film 38, the cap insulating film 68, and the fourth insulating film 44. The seventh insulating film 70 includes, for example, silicon dioxide. The seventh insulating film 70 is formed, for example, by the CVD technique. A third structure M which is a structure shown in FIG. 12 can be obtained by the above steps.

Figure 13:
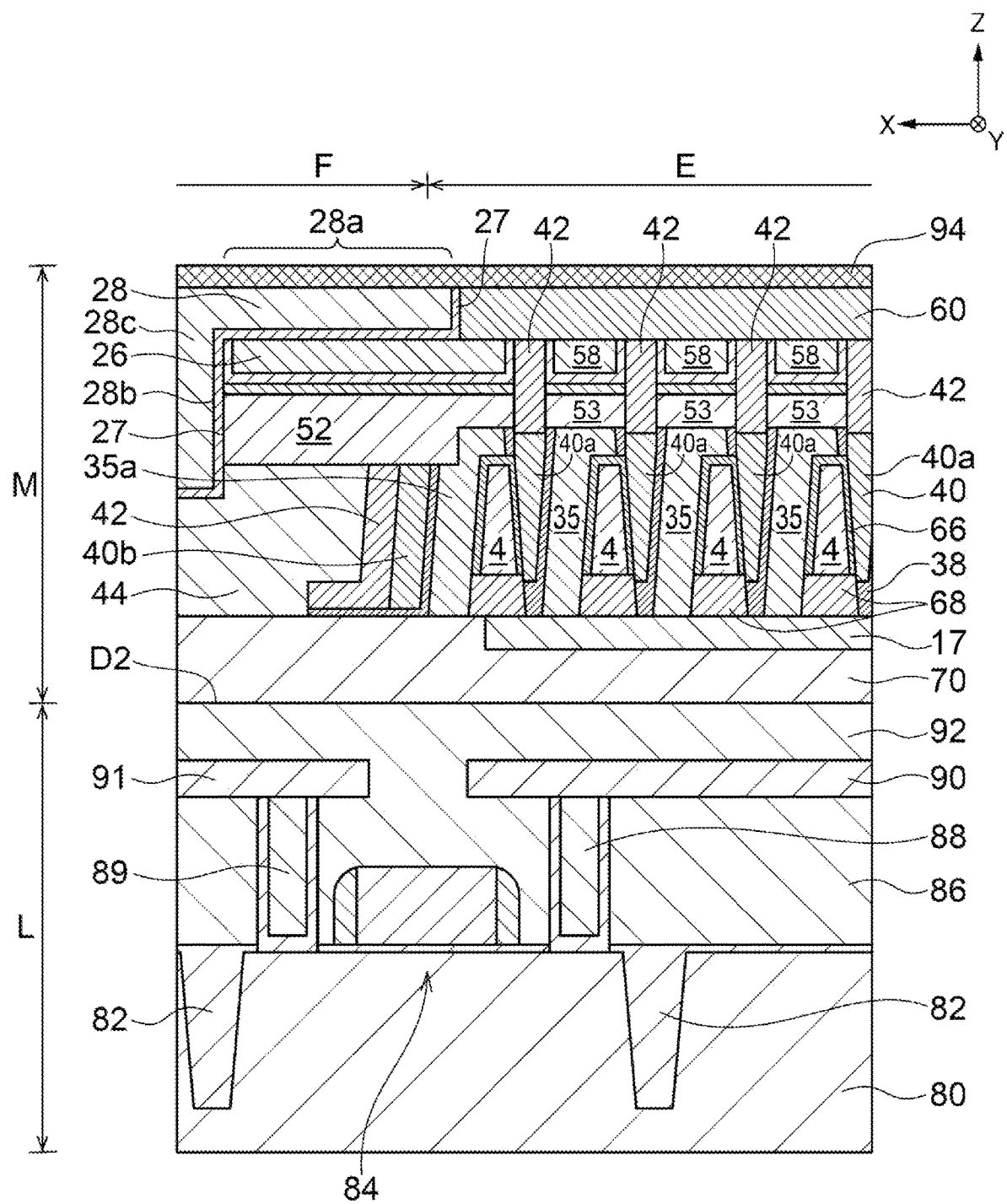

Next, as shown in FIG. 13, a second structure L including the second semiconductor substrate 80, the isolation 82, the peripheral circuit transistor 84, the eighth insulating film 86, the wirings 90 and 91 and the ninth insulating film 92 is prepared. Next, the third structure M is reversed upside down or vertically. The third structure M and the second structure L are bonded to each other by a wafer bonding technique. For example, a fusion bonding technique can be used in the wafer bonding technique. The third structure M and the second structure L are bonded to each other at a joint surface D2. At the joint surface D2, the surface of the seventh insulating film 70 and the surface of the second structure L are in contact with each other.

Next, an extraction electrode groove 27 is formed on the upper landing pad 26 of the peripheral region F so as to partially overlap the upper landing pad 26. The extraction electrode groove 27 is formed by removing parts of the fifth insulating film 60 and the fourth insulating film 44 using the known lithography technique and the known anisotropic dry etching technique. The fifth insulating film 60 and the fourth insulating film 44 are removed so that the upper surface of the upper landing pad 26 and the side surfaces of the upper landing pad 26 and the lower landing pad 52 are exposed, and the extraction electrode groove 27 is removed at the position where these films are removed.

Next, a barrier metal film and a metal film are formed so as to cover the inside of the extraction electrode groove 27 and the upper surface of the fifth insulating film 60. The barrier metal film includes, for example, titanium nitride. The metal film includes, for example, tungsten. The barrier metal film and the metal film are formed, for example, by the CVD technique. Next, etch-back using the anisotropic dry etching is performed on the barrier metal film and the metal film. The etch-back is performed to the extent that the upper surface of the fifth insulating film 60 is exposed. As a result, the barrier metal film and the metal film remaining in the extraction electrode groove 27 serves as the fourth extraction electrode 28. The barrier metal film serves as the upper barrier metal 28b, and the metal film serves as the upper metal film 28c.

The region where the fourth extraction electrode 28 and the upper landing pad 26 overlap each other serves as the overlap portion 28a. Next, a tenth insulating film 94 is formed so as to cover the upper surfaces of the fourth extraction electrode 28 and the fifth insulating film 60. The tenth insulating film 94 includes silicon nitride, and it is formed, for example, by the CVD technique. A structure shown in FIG. 13 is formed by the above steps.

Next, as shown in FIG. 4, the storage capacitors 24 are formed. The storage capacitors 24 are formed as follows. Patterning is performed on the tenth insulating film 94 and the fifth insulating film 60 by using the known lithography technology and the known anisotropic dry etching technique to form contact holes which open the pedestal portions 58 and parts of the fourth extraction electrode 28 and the upper landing pad 26. The contact holes are patterned so as to have a layout similar to the layout of the storage capacitors 24 and the dummy capacitors 25 shown in FIG. 3.

Next, a conductive material is formed so as to cover the insides of the contact holes and the top of the tenth insulating film 94. For example, titan nitride is formed as the conductive material. The conductive material is formed, for example, by the CVD technique. Next, the conductive material is patterned by using the known lithography technique and the known anisotropic dry etching technique to form the pillar-shaped lower electrodes 24a and the dummy lower electrodes 25a. The dummy lower electrodes 25a of the dummy capacitors 25 are arranged on the upper landing pad 26 and a part of the fourth extraction electrode 28.

Next, cleaning and a pretreatment are performed so that the surfaces of the lower electrodes 24a and the dummy lower electrodes 25a are cleaned. The cleaning is performed, for example, by APM cleaning (ammonia-hydrogen peroxide mixture cleaning) using a mixed chemical liquid of ammonia water and hydrogen peroxide solution, FPM cleaning (hydrofluoric acid-hydrogen peroxide mixture cleaning) using a mixed chemical liquid of hydrofluoric acid and hydrogen peroxide solution, or the like. In the pretreatment, for example, BHF is used.

Next, the capacitive insulating film 24b and the dummy capacitive insulating film 25b are formed on the surfaces of the lower electrodes 24a and the dummy lower electrodes 25a. The capacitive insulating film 24b and the dummy capacitive insulating film 25b include, for example, a high-k film having a high relative permittivity, and include, for example, metal oxides such as hafnium oxide ($HfO_2$), zirconium oxide ($ZrO_2$), and aluminum oxide ($Al_2O_3$). The capacitive insulating film 24b and the dummy capacitive insulating film 25b are formed, for example, by the CVD technique.

Next, the upper electrode 24c is formed so as to cover the upper and side surfaces of the lower electrodes 24a and the dummy lower electrodes 25a covered with the capacitive insulating film 24b and the dummy capacitive insulating film 25b. The upper electrode 24c includes, for example, titanium nitride. The upper electrode 24c is formed, for example, by forming a conductive material using the CVD technique and then patterning the conductive material using the known lithography technique and the known anisotropic dry etching.

The capacitive insulating film 24b and the dummy capacitive insulating film 25b are sandwiched between the lower electrodes 24a and the dummy lower electrodes 25a and the upper electrode 24c. The lower electrodes 24a, the capacitive insulating film 24b, and the upper electrode 24c function as capacitors, and can store and discharge charges. The upper electrode 24c is connected to a plate electrode (not shown). Next, the eleventh insulating film 96 that covers the storage capacitors 24 and the tenth insulating film 94 is formed. The eleventh insulating film 96 includes, for example, silicon dioxide, and is formed, for example, by the CVD technique.

The semiconductor device 1 according to the embodiment is formed by the above steps as shown in FIG. 4.

Figure 14:
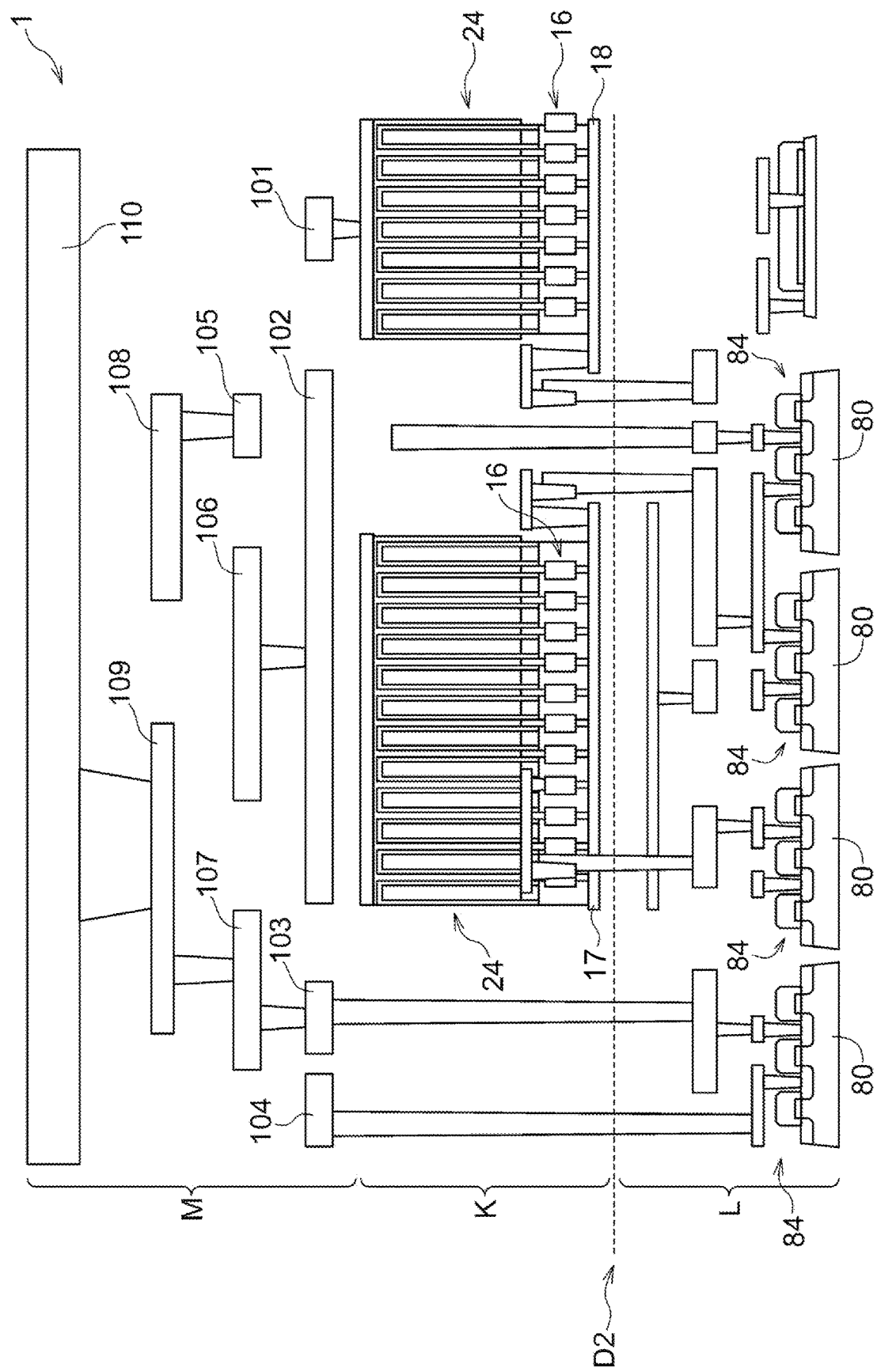
FIG. 14 is a vertical cross-sectional view showing a schematic overall configuration of the semiconductor device according to the embodiment.

FIG. 14 is a vertical cross-sectional view showing an outline of the overall configuration of the semiconductor device 1 including the above-mentioned first structure K. As shown in FIG. 14, the semiconductor device 1 includes the first structure K, the second structure L, and the third structure M.

The first structure K constitutes a memory cell portion of the semiconductor device, and includes a plurality of bit lines 17, access transistors 16, and storage capacitors 24. The access transistor 16 includes the gate electrode 4, that is, the word line 18 as shown in FIG. 2.

The second structure L includes a peripheral circuit for driving the memory cells. The peripheral circuit includes, for example, peripheral circuit transistors 84 formed on the second semiconductor substrate 80. The surface of the second semiconductor substrate 80 constitutes a plane parallel to the X-Y plane, and the peripheral circuit transistors 84 are formed on the surface of the second semiconductor substrate 80. The third structure M includes a plurality of wirings 101 to 110.

In the semiconductor device according to the embodiment, the second structure L and the first structure K are stacked and arranged in the Z direction. The access transistor 16 extends in the channel direction perpendicular to the second semiconductor substrate 80. Further, the longitudinal direction of the storage capacitor 24 is perpendicular to the second semiconductor substrate 80. Therefore, the planar area occupied by the memory cell and the peripheral circuit can be reduced, and the chip area of the semiconductor device 1 can be reduced. Therefore, it is possible to provide a semiconductor device with reduced cost.

According to the semiconductor device 1 of the embodiment, the fourth extraction electrode 28 connected to the outer peripheral shield structure 40b is provided in the vicinity of the corner portion of the memory mat 2 in the memory cell region E. Further, the outer peripheral shield structure 40b and the fourth extraction electrode 28 are connected to each other via the lower landing pad 52 and the upper landing pad 26 which are provided between the outer peripheral shield structure 40b and the fourth extraction electrode 28. The upper landing pad 26 is arranged around the plurality of storage capacitors 24 of the memory mat 2, and is connected to the outer peripheral shield structure 40b of the shield structure 40 arranged in a mesh pattern. As a result, it is possible to provide the fourth extraction electrode 28 electrically connected to the shield structure 40 of the memory cell region E.

Further, the dummy lower electrodes 25a of the dummy capacitors 25 are provided so as to be in contact with parts of the upper surfaces of the upper landing pad 26 and the fourth extraction electrode 28. The lower surfaces of the dummy capacitors 25 are in contact with the upper surfaces of the upper landing pad 26 and the fourth extraction electrode 28. As a result, an effect of suppressing a phenomenon that a chemical liquid infiltrates to etch the insulating films of silicon dioxide, etc. and thus voids, etc. are formed is achieved in a chemical liquid treatment to be carried out during the step of forming the storage capacitors 24 and the dummy capacitors 25.

Further, the above steps makes it possible to form the semiconductor device 1 in which the access transistors 16 and the storage capacitors 24 are arranged to be vertically stacked in the Z direction. The access transistor 16 is formed as a vertical metal-oxide-semiconductor field-effect transistor (hereinafter referred to as MOSFET) in which the channel region formed in the channel pillar 35 is formed to extend in the Z direction, that is, in the vertical direction. By arranging the access transistors 16 in this way, the area on which the memory cells occupy on the X-Y plane can be reduced, so that a highly integrated semiconductor device 1 can be achieved.

As described above, the semiconductor device according to the embodiment has been described by exemplifying DRAM. However, this is an example, and it is not intended to limit the semiconductor device to DRAM. The semiconductor device to be applied may be memory devices other than DRAM, for example, a static random access memory (SRAM), a flash memory, an erasable programmable read only memory (EPROM), a magnetoresistive random access memory (MRAM), a phase-change memory, etc. Further, the semiconductor device according to the above embodiment to be applied may be devices other than memories, for example, a microprocessor and a logic IC such as an application specific integrated circuit (ASIC).

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus, comprising:
a memory mat including a plurality of vertical memory cell transistors;
a shield structure surrounding each of the plurality of vertical memory cell transistors, the shield structure comprising a conductive material; and
a ring-shaped wiring above the shield structure, the ring-shaped wiring being connected to the shield structure in an edge region of the shield structure.

2. The apparatus of claim 1, further comprising at least one power wiring above the ring-shaped wiring, the at least power wiring being connected to the ring- shaped wiring in a corner region of the ring-shaped wiring.

3. The apparatus of claim 1, wherein the shield structure comprises a main surface portion surrounding top portions of channels of the plurality of vertical memory cell transistors.

4. The apparatus of claim 3, wherein the shield structure further comprises vertically extending portions each formed adjacently to a corresponding one of gates of the plurality of vertical memory cell transistors.

5. The apparatus of claim 1, further comprising a plurality of memory cell capacitors, each of the plurality of memory cell capacitors being on a corresponding one of top portions of channels of the plurality of vertical memory cell transistors.

6. The apparatus of claim 1, wherein the shield structure comprises silicon doped with phosphorus or arsenic as an impurity.

7. An apparatus,. comprising:
a semiconductor substrate;
a memory mat region on the semiconductor substrate;
a plurality of channel pillars arranged in the memory mat region and arranged so as to extend in a direction perpendicular to an upper surface of the semiconductor substrate;
a plurality of peripheral pillars surrounding an outermost periphery of the memory mat region;
a shield structure arranged between the plurality of channel pillars and the plurality of peripheral pillars, the shield structure having a first portion surrounding each of the plurality of channel pillars and a second portion surrounding each of the plurality of peripheral pillars, the shield structure comprising a conductive material; and
an extraction electrode electrically connected to the shield structure.

8. The apparatus of claim 7, further comprising:
a plurality of storage capacitors, each of the plurality of storage capacitors being connected to one side of a corresponding one of the plurality of channel pillars; and
a plurality of bit lines, each of the plurality of bit lines being connected to another side of the corresponding one of the plurality of channel pillars.

9. The apparatus of claim 7, further comprising a landing pad arranged between the second portion of the shield structure and the extraction electrode, the landing pad being connected to the second portion of the shield structure and the extraction electrode.

10. The apparatus of claim 9, wherein the landing pad is provided so as to surround the memory mat region.

11. The apparatus of claim 7, wherein the shield structure comprises silicon doped with phosphorus or arsenic as an impurity.

12. The apparatus of claim 7, wherein the extraction electrode comprises titanium nitride.

13. An apparatus, comprising:
a semiconductor substrate;
a memory mat arranged on the semiconductor substrate and having a rectangular shape,
a plurality of storage capacitors arranged in the memory mat;
a plurality of dummy capacitors arranged to surround the plurality of storage capacitors; and
a landing pad surrounding the plurality of storage capacitors;
wherein the plurality of dummy capacitors are located above the landing pad,
wherein the apparatus further comprises:
a plurality of channel pillars arranged in the memory mat, each of the plurality of channel pillars being electrically connected to a corresponding one of the plurality of storage capacitors;
a plurality of peripheral pillars surrounding the plurality of channel pillars; and a shield structure surrounding each of the plurality of channel pillars and each of the plurality of peripheral pillars in a mesh pattern, the shield structure comprising a conductive material.

14. The apparatus of claim 13, further comprising:
wherein the shield structure comprises a center shield structure arranged in a center region of the shield structure and a peripheral shield structure surrounding the center shield structure; and
wherein the landing pad is electrically connected to the plurality of dummy capacitors, the plurality of peripheral pillars, and the peripheral shield structure.

15. The apparatus of claim 14, wherein the landing pad is arranged between the plurality of dummy capacitors and the peripheral shield structure.

16. The apparatus of claim 14, wherein each of the plurality of channel pillars and each of the plurality of storage capacitors corresponding to each other are stacked in a direction perpendicular to an upper surface of the semiconductor substrate.

17. The apparatus of claim 14, further comprising a lower pad and a pedestal on the lower pad, wherein both the lower pad and the pedestal are between the corresponding one of the plurality of storage capacitors and a corresponding one of the plurality of channel pillars;
wherein the landing pad comprises a lower landing pad and an upper landing pad on the lower landing pad; and
wherein the lower landing pad and the lower pad comprise a same material, and the upper landing pad and the pedestal comprise a same material.

18. The apparatus of claim 14, wherein the shield structure comprises silicon doped with phosphorus or arsenic as an impurity.

* * * * *

UNITED STATES PATENT AND TRADEMARK OFFICE
CERTIFICATE OF CORRECTION

PATENT NO.         : 11,917,814 B2
APPLICATION NO.    : 17/711972
DATED              : February 27, 2024
INVENTOR(S)        : Mitsunari Sukekawa It is certified that error appears in the above-identified patent and that said Letters Patent is hereby corrected as shown below:

In the Claims

| | Claim | Reads | Should Read |
|---|---|---|---|
| Column 14, Line 11 | 7 | "An apparatus,. comprising:" | -- An apparatus, comprising: -- |
| Column 15, Line 5 | 14 | "The apparatus of claim 13, further comprising:" | -- The apparatus of claim 13, -- |

Signed and Sealed this
Twenty-eighth Day of May, 2024

*Katherine Kelly Vidal*

Katherine Kelly Vidal
*Director of the United States Patent and Trademark Office*